(12) United States Patent
Hasegawa et al.

(10) Patent No.: US 12,125,677 B2
(45) Date of Patent: *Oct. 22, 2024

(54) HIGH-FREQUENCY POWER SUPPLY APPARATUS

(71) Applicant: DAIHEN Corporation, Osaka (JP)

(72) Inventors: Yuichi Hasegawa, Osaka (JP); Yuya Ueno, Osaka (JP); Tatsuya Morii, Osaka (JP)

(73) Assignee: DAIHEN CORPORATION, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/086,377

(22) Filed: Dec. 21, 2022

(65) Prior Publication Data

US 2023/0207263 A1   Jun. 29, 2023

(30) Foreign Application Priority Data

Dec. 28, 2021   (JP) .................................. 2021-214970

(51) Int. Cl.
 *H01J 37/32*   (2006.01)
 *H03K 21/08*   (2006.01)

(52) U.S. Cl.
 CPC .. *H01J 37/32165* (2013.01); *H01J 37/32183* (2013.01); *H03K 21/08* (2013.01);
 (Continued)

(58) Field of Classification Search
 CPC ........... H01J 37/32165; H01J 37/32183; H01J 37/32128; H01J 2237/24564;
 (Continued)

(56) References Cited

U.S. PATENT DOCUMENTS 9,030,101 B2   5/2015   Valcore, Jr. et al.
9,114,666 B2   8/2015   Valcore, Jr. et al.
(Continued)

FOREIGN PATENT DOCUMENTS

JP   2017-188434 A   10/2017
JP   2018-536295 A   12/2018

*Primary Examiner* — Jared Fureman
*Assistant Examiner* — Michael J Warmflash
(74) *Attorney, Agent, or Firm* — Rimon P.C.

(57) ABSTRACT

A high-frequency power supply apparatus includes the following elements. A first power supply outputs a first high-frequency voltage with a first fundamental frequency. A second power supply outputs a second high-frequency voltage with a second fundamental frequency lower than the first fundamental frequency. A second matching device is connected between the second power supply and the load. The second matching device generates a timing control signal with a frequency lower than the second fundamental frequency. The first power supply generates a modulation signal by applying a start phase and a frequency shift amount to a modulation fundamental wave signal whose frequency is equal to the second fundamental frequency. The start phase is applied to the modulation fundamental wave signal in accordance with an input timing of the timing control signal. The first power supply performs frequency modulation on the first high-frequency voltage by using the modulation signal.

7 Claims, 5 Drawing Sheets

(52) U.S. Cl.
CPC .............. *H01J 37/32128* (2013.01); *H01J 2237/24564* (2013.01)

(58) Field of Classification Search
CPC ........... H01J 37/32146; H01J 37/32174; H01J 37/32155; H03K 21/08
See application file for complete search history.

(56) References Cited

U.S. PATENT DOCUMENTS

| | | | |
|---|---|---|---|
| 9,171,699 B2 | 10/2015 | Valcore, Jr. et al. | |
| 9,197,196 B2 | 11/2015 | Valcore, Jr. et al. | |
| 9,236,228 B2 | 1/2016 | Valcore, Jr. et al. | |
| 9,295,148 B2 | 3/2016 | Fong et al. | |
| 9,320,126 B2 | 4/2016 | Valcore, Jr. et al. | |
| 9,337,000 B2 | 5/2016 | Marakhtanov et al. | |
| 9,368,329 B2 | 6/2016 | Valcore, Jr. et al. | |
| 9,390,893 B2 | 7/2016 | Valcore, Jr. et al. | |
| 9,401,264 B2 | 7/2016 | Marakhtanov et al. | |
| 9,462,672 B2 | 10/2016 | Valcore, Jr. et al. | |
| 9,502,216 B2 | 11/2016 | Valcore, Jr. et al. | |
| 9,530,620 B2 | 12/2016 | Valcore, Jr. | |
| 9,607,810 B2 | 3/2017 | Valcore, Jr. et al. | |
| 9,620,334 B2 | 4/2017 | Lyndaker et al. | |
| 9,620,337 B2 | 4/2017 | Valcore, Jr. et al. | |
| 9,711,332 B2 | 7/2017 | Howald et al. | |
| 9,720,022 B2 | 8/2017 | Howald et al. | |
| 9,779,196 B2 * | 10/2017 | Valcore, Jr. | G06F 30/36 |
| 9,812,294 B2 | 11/2017 | Valcore, Jr. et al. | |
| 9,831,065 B2 | 11/2017 | Fong et al. | |
| 9,831,071 B2 | 11/2017 | Howald et al. | |
| 9,837,252 B2 | 12/2017 | Howald et al. | |
| 9,842,725 B2 | 12/2017 | Valcore, Jr. et al. | |
| 9,947,514 B2 * | 4/2018 | Radomski | H01J 37/32183 |
| 9,960,015 B2 | 5/2018 | Valcore, Jr. et al. | |
| 9,997,333 B2 | 6/2018 | Valcore, Jr. et al. | |
| 10,008,371 B2 | 6/2018 | Valcore, Jr. et al. | |
| 10,032,605 B2 | 7/2018 | Valcore, Jr. et al. | |
| 10,074,520 B2 | 9/2018 | Valcore, Jr. et al. | |
| 10,128,090 B2 | 11/2018 | Valcore, Jr. et al. | |
| 10,157,729 B2 * | 12/2018 | Valcore, Jr. | H01J 37/32082 |
| 10,157,730 B2 | 12/2018 | Marakhtanov et al. | |
| 10,163,605 B2 | 12/2018 | Fong et al. | |
| 10,231,321 B2 | 3/2019 | Valcore, Jr. et al. | |
| 10,249,476 B2 | 4/2019 | Marakhtanov et al. | |
| 10,256,077 B2 | 4/2019 | Valcore, Jr. et al. | |
| 10,276,350 B2 | 4/2019 | Howald et al. | |
| 10,296,676 B2 | 5/2019 | Howald et al. | |
| 10,304,669 B1 | 5/2019 | Coumou et al. | |
| 10,319,570 B2 | 6/2019 | Valcore, Jr. et al. | |
| 10,325,759 B2 * | 6/2019 | Valcore, Jr. | H01J 37/32935 |
| 10,340,127 B2 | 7/2019 | Valcore, Jr. et al. | |
| 10,381,201 B2 | 8/2019 | Lyndaker et al. | |
| 10,403,482 B2 | 9/2019 | Howald et al. | |
| 10,469,108 B2 * | 11/2019 | Howald | G05B 17/02 |
| 10,474,780 B2 | 11/2019 | Valcore, Jr. et al. | |
| 10,621,265 B2 | 4/2020 | Howald et al. | |
| 10,629,413 B2 | 4/2020 | Valcore, Jr. et al. | |
| 10,707,056 B2 | 7/2020 | Valcore, Jr. et al. | |
| 10,748,748 B2 | 8/2020 | Valcore, Jr. et al. | |
| 10,762,266 B2 | 9/2020 | Valcore, Jr. et al. | |
| 10,853,444 B2 | 12/2020 | Valcore, Jr. et al. | |
| 10,911,081 B2 | 2/2021 | Howald et al. | |
| 11,361,942 B2 | 6/2022 | Valcore, Jr. et al. | |
| 2015/0096684 A1 * | 4/2015 | Nagami | H01J 37/32174 |
| | | | 156/345.28 |
| 2015/0122421 A1 * | 5/2015 | Konno | H01J 37/32183 |
| | | | 156/345.28 |
| 2016/0268100 A1 | 9/2016 | Vaicore, Jr. et al. | |
| 2017/0062187 A1 | 3/2017 | Radomski et al. | |
| 2018/0323038 A1 | 11/2018 | Valcore, Jr. et al. | |
| 2019/0318919 A1 | 10/2019 | Lyndaker et al. | |
| 2023/0207263 A1 * | 6/2023 | Hasegawa | H01J 37/32146 |
| | | | 327/540 |
| 2023/0207264 A1 * | 6/2023 | Hasegawa | H01J 37/32174 |
| | | | 307/52 |
| 2023/0207270 A1 * | 6/2023 | Hasegawa | H01J 37/32183 |
| | | | 315/111.21 |

* cited by examiner

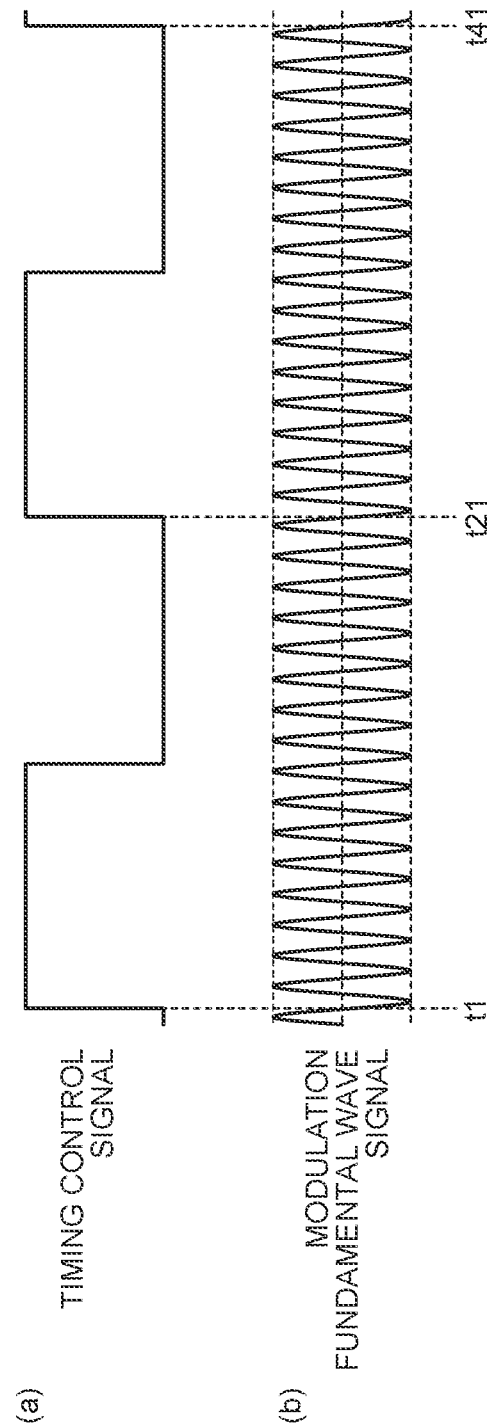

HIGH-FREQUENCY POWER SUPPLY APPARATUS

CROSS-REFERENCE TO RELATED APPLICATIONS

This application is based upon and claims the benefit of priority from Japanese Patent Application No. 2021-214970, filed on Dec. 28, 2021, the entire contents of which are incorporated herein by reference.

FIELD

The present disclosure relates generally to a high-frequency power supply apparatus.

BACKGROUND

A high-frequency power supply apparatus used for a plasma processing device has been known (for example, JP 2018-536295 A, JP 2017-188434 A, and U.S. Pat. No. 10,304,669 B1). Such a high-frequency power supply apparatus includes two high-frequency power supplies (a first power supply and a second power supply) and outputs high-frequency voltages with different fundamental frequencies (frequencies of fundamental waves) from the respective power supplies toward a load. For example, the first power supply supplies a first high-frequency power to the load by outputting a first high-frequency voltage with a first fundamental frequency F1 suitable for plasma generation. The second power supply supplies a second high-frequency power to the load by outputting a second high-frequency voltage with a second fundamental frequency F2 (F1>F2) suitable for ion acceleration.

In such a case, InterModulation Distortion (IMD) occurs, and a phenomenon that reflected wave power fluctuates according to the cycle of the second fundamental frequency F2 occurs on the first power supply side. In order to reduce the reflected wave power caused by the intermodulation distortion, a technique of performing frequency modulation control on the first high-frequency voltage has been known. It is conceivable to generate a modulation signal whose frequency is equal to the second fundamental frequency F2, on the basis of information of the second fundamental frequency F2 of the second power supply known in advance (for example, information of 400 kHz has been known), and perform the frequency modulation control in the first power supply by using the generated modulation signal.

However, the cycle of the modulation signal generated in a pseudo manner is different from the cycle of the high-frequency voltage output from the second power supply. When the cycles are different as described above, the effect of reducing the reflected wave power caused by the intermodulation distortion may deteriorate by the frequency modulation control.

SUMMARY

A high-frequency power supply apparatus according to the present disclosure includes a first power supply, a second power supply, a first matching device, and a second matching device. The first power supply is configured to supply first high-frequency power to a load by outputting a first high-frequency voltage with a first fundamental frequency. The second power supply is configured to supply second high-frequency power to the load by outputting a second high-frequency voltage with a second fundamental frequency being lower than the first fundamental frequency. The first matching device is connected between the first power supply and the load. The second matching device is connected between the second power supply and the load. The second matching device is configured to generate a timing control signal with a frequency being lower than the second fundamental frequency on the basis of detection information of the second high-frequency voltage, and supply the timing control signal to the first power supply. The first power supply is further configured to generate a modulation signal by applying a start phase and a frequency shift amount to a modulation fundamental wave signal whose frequency is equal to the second fundamental frequency. The start phase is applied to the modulation fundamental wave signal in accordance with an input timing of the timing control signal. The first power supply is further configured to perform frequency modulation on the first high-frequency voltage by using the modulation signal.

BRIEF DESCRIPTION OF THE DRAWINGS

FIG. 5 is a waveform diagram illustrating operation of the high-frequency power supply apparatus according to the embodiment.

DETAILED DESCRIPTION

Hereinafter, an embodiment of the high-frequency power supply apparatus according to the present disclosure will be described with reference to the drawings.

Embodiment

The high-frequency power supply apparatus according to the embodiment is an apparatus that supplies high-frequency power to a load (for example, a plasma processing device) by outputting a high-frequency voltage with a frequency in a radio frequency (RF) band. Such a high-frequency power supply apparatus includes two high-frequency power supplies (a first power supply and a second power supply), and outputs high-frequency voltages with different fundamental frequencies (frequencies of fundamental waves) (also referred to as output frequencies) from each of the power supplies toward a load. For example, the first power supply supplies a first high-frequency power to the load by outputting a first high-frequency voltage with a first fundamental frequency F1 suitable for plasma generation. The second power supply supplies a second high-frequency power to the load by outputting a second high-frequency voltage with a second fundamental frequency F2 (F1>F2) suitable for ion acceleration.

In a case where such high-frequency powers with difference frequencies are supplied from power supplies to a load as described above, a phenomenon occurs on the first power supply side such that reflected wave power fluctuates in accordance with a basic cycle (cycle of the fundamental wave) on the second power supply side due to an influence of intermodulation distortion. Therefore, the high-frequency power cannot be efficiently supplied from the first power supply to the load. In consideration of this issue, in the present embodiment, the frequency modulation control is performed as described below to reduce the reflected wave power caused by intermodulation distortion.

Note that the high-frequency voltage output from the first power supply to the load is referred to as a first traveling wave voltage, and the high-frequency voltage reflected from the load side and returned to the first power supply is referred to as a first reflected wave voltage. The high-frequency voltage output from the second power supply to the load is referred to as a second traveling wave voltage, and the high-frequency voltage reflected from the load side and returned to the second power supply is referred to as a second reflected wave voltage.

Figure 1:
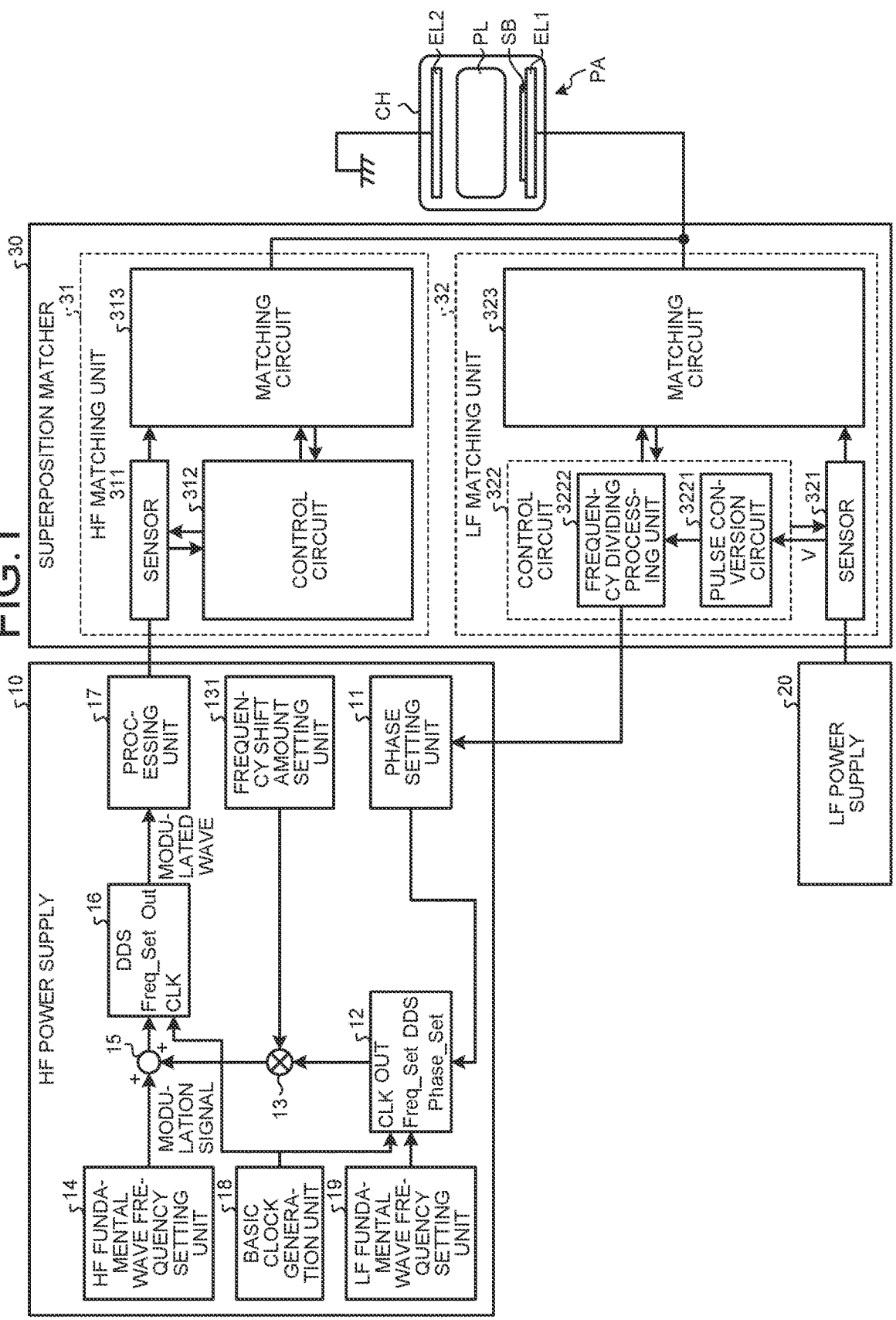
FIG. 1 is a diagram illustrating a configuration of a high-frequency power supply apparatus according to an embodiment.

FIG. 1 is a diagram illustrating a configuration of a high-frequency power supply apparatus 1. The high-frequency power supply apparatus 1 is applied to a plasma processing device PA. The plasma processing device PA is of a parallel plate type, and a lower electrode EL1 and an upper electrode EL2 face each other in a chamber CH. A substrate SB to be processed can be placed on the lower electrode EL1. The high-frequency power supply apparatus 1 is electrically connected to the lower electrode EL1. The upper electrode EL2 is electrically connected to ground potential. The chamber CH is connected to a gas supply device (not illustrated) via an air supply pipe, and is connected to a vacuum device (not illustrated) via an exhaust pipe.

The high-frequency power supply apparatus 1 includes an HF power supply (first power supply) 10, an LF power supply (second power supply) 20, and a superposition matcher 30. The HF power supply 10 supplies a first high-frequency power (first traveling wave power) to the load by outputting a first high-frequency voltage (first traveling wave voltage) with a first fundamental frequency F1. The first high-frequency voltage mainly has a relatively high first fundamental frequency F1 suitable for generation of plasma PL. The first fundamental frequency F1 is, for example, 40.68 MHz. The HF power supply 10 is also referred to as the source power supply. Note that the fundamental frequency F1 is not limited to 40.68 MHz, and may be, for example, a frequency of an industrial radio frequency (RF) such as 13.56 MHz or 27.12 MHz.

The LF power supply 20 supplies a second high-frequency power (second traveling wave power) to the load by outputting a second high-frequency voltage (second traveling wave voltage) with a second fundamental frequency F2 lower than the first fundamental frequency F1. The second high-frequency voltage has a relatively low second fundamental frequency F2 suitable for ion acceleration. The second fundamental frequency F2 is, for example, 400 kHz. The LF power supply 20 is also referred to as the bias power supply. Note that the second fundamental frequency F2 is not limited to 400 kHz, but may be another frequency.

The superposition matcher 30 is electrically connected to the HF power supply 10 and the LF power supply 20. The superposition matcher 30 is electrically connected between the HF power supply 10 and the LF power supply 20, and the lower electrode EL1. The superposition matcher 30 performs a first matching operation of matching the impedance on the HF power supply 10 side and the impedance on the lower electrode EL1 side. The superposition matcher 30 also performs a second matching operation of matching the impedance on the LF power supply 20 side and the impedance on the lower electrode EL1 side. In a state where the first matching operation and the second matching operation have been performed, the superposition matcher 30 receives the first high-frequency power from the HF power supply 10 and receives the second high-frequency power from the LF power supply 20. Then, the superposition matcher 30 superposes the first high-frequency power and the second high-frequency power and supplies the resulting power to the lower electrode EL1.

Note that the high-frequency power supply apparatus 1 and the plasma processing device PA are not limited to the configuration illustrated in FIG. 1. There are various configurations that include, for example, a configuration that the first high-frequency power output from the HF power supply 10 is supplied to the upper electrode EL2 via the superposition matcher 30, and the second high-frequency power output from the LF power supply 20 is supplied to the lower electrode EL1 via the superposition matcher 30. The high-frequency power supply apparatus 1 can also be used for another configuration as described above.

The superposition matcher 30 includes an HF matching unit (first matching unit) 31 and an LF matching unit (second matching unit) 32. The HF matching unit 31 is electrically connected between the HF power supply 10 and the lower electrode EL1. The LF matching unit 32 is electrically connected between the LF power supply 20 and the lower electrode EL1. The HF matching unit 31 performs the first matching operation, and the LF matching unit 32 performs the second matching operation.

The HF matching unit 31 includes a sensor 311, a control circuit 312, and a matching circuit 313. The sensor 311 detects a waveform signal SG1$f$ of the first traveling wave voltage output from the HF power supply 10, and detects a waveform signal SG1$r$ of the first reflected wave voltage reflected from the matching circuit 313 side. The matching circuit 313 includes a variable impedance circuit. An impedance value of the variable impedance circuit is changed by the control circuit 312 in accordance with the waveform signal SG1$f$ and the waveform signal SG1$r$ detected by the sensor 311 (such that, for example, the reflection coefficient calculated from the waveform signal SG1$f$ and the waveform signal SG1$r$ is reduced). Needless to say, the impedance value of the variable impedance circuit can be changed such that the reflected wave power is reduced instead of the reflection coefficient. Note that the variable impedance circuit includes, for example, a variable capacitor and an inductor, which are not illustrated. The impedance value can be changed by changing the capacitance of the variable capacitor (the same configuration is applied to the LF matching unit 32). In the above description, as an example, the reflection coefficient is calculated by using the waveform signal SG1$f$ of the first traveling wave voltage and the waveform signal SG1$r$ of the first reflected wave voltage, but it is also possible to detect a voltage waveform signal and a current waveform signal and calculate the reflection coefficient on the basis of them (the same configuration is applied the LF matching unit 32).

The LF matching unit 32 includes a sensor 321 (detection unit 321), a control circuit 322, and a matching circuit 323. The control circuit 322 includes a pulse conversion circuit 3221 (conversion unit 3221) and a frequency dividing processing unit 3222 (frequency dividing unit 3222). The sensor 321 detects a waveform signal SG2$f$ of the second traveling wave voltage output from the LF power supply 20, and detects a waveform signal SG2$r$ of the second reflected wave voltage reflected from the matching circuit 323 side.

The matching circuit 323 includes a variable impedance circuit. An impedance value of the variable impedance circuit in the matching circuit 323 is changed by the control circuit 322 in accordance with the waveform signal SG2*f* and the waveform signal SG2*r* detected by the sensor 321 (such that, for example, the reflection coefficient calculated from the waveform signal SG2*f* and the waveform signal SG2*r* is reduced). Needless to say, the impedance value of the variable impedance circuit can be changed such that the reflected wave power is reduced instead of the reflection coefficient.

The pulse conversion circuit 3221 converts the waveform signal SG2*f* of the second traveling wave voltage detected by the sensor 321 into a pulse signal. The pulse signal is converted as a rectangular signal with the second fundamental frequency F2. The pulse conversion circuit 3221 includes a comparator and converts a sine wave signal into a rectangular signal using the comparator. The frequency dividing processing unit 3222 divides, by N, the pulse signal with the second fundamental frequency F2 to generate a timing control signal TC with a frequency F3. N is an integer of two or more. The frequency F3 is a frequency of at least 1/N times or less the fundamental frequency F1. With this operation, the edge timing of the timing control signal TC can be matched with a predetermined phase timing at the second high-frequency voltage.

In a case where F2=400 kHz and N=10, F3=F2×1/N=400 kHz×1/10=40 kHz. The timing control signal TC is a signal generated in accordance with the second traveling wave voltage. Thus, the timing control signal TC can be a signal synchronized with the second traveling wave voltage. The frequency dividing processing unit 3222 supplies, to the HF power supply 10, the timing control signal TC with the frequency F3.

The HF power supply 10 receives the timing control signal TC generated by the LF matching unit 32. The HF power supply 10 generates a modulation fundamental wave signal, which corresponds to the second traveling wave voltage, in accordance with the timing control signal TC. The HF power supply 10 generates, by using the modulation fundamental wave signal, a modulation signal whose cycle is equal to the cycle of the second traveling wave voltage (second high-frequency voltage) output from the LF power supply 20. This modulation signal is used for the frequency modulation control to be performed on the first traveling wave voltage (first high-frequency voltage) output from the HF power supply 10.

The HF power supply 10 includes a phase setting unit 11, a direct digital synthesizer (DDS) 12, a multiplier 13, an HF fundamental wave frequency setting unit 14, an adder 15, a direct digital synthesizer (DDS) 16, a processing unit 17, a basic clock generation unit 18, an LF fundamental wave frequency setting unit 19, and a frequency shift amount setting unit 131.

The LF fundamental wave frequency setting unit 19 generates frequency information of the modulation fundamental wave with the frequency of the second fundamental frequency F2. The frequency information is information sequentially including the amplitude for each clock timing in accordance with the frequency of the modulation fundamental wave signal (for example, sine wave signal) to be generated. The LF fundamental wave frequency setting unit 19 supplies the frequency information of the modulation fundamental wave signal to the direct digital synthesizer 12.

The phase setting unit 11 receives the timing control signal TC from the superposition matcher 30 and sets a modulation start phase at which modulation of the modulation fundamental wave signal is to be started. With this operation, the phase setting unit 11 can set a modulation start phase at which modulation is to be started at the same timing as the second high-frequency voltage of the LF power supply. The phase setting unit 11 supplies the information of the modulation start phase to the direct digital synthesizer 12.

The basic clock generation unit 18 generates a basic clock signal. The basic clock signal is adjusted in advance to be a signal synchronized with the second traveling wave voltage. Additionally, the basic clock signal has a frequency that is an integral multiple of the second fundamental frequency F2. In the case of F2=400 kHz, the frequency of the basic clock signal may be F2×250=400 kHz×250=100 MHz. The basic clock generation unit 18 supplies the basic clock signal to each of the direct digital synthesizer 12 and the direct digital synthesizer 16. Note that the basic clock generation unit 18 can include, for example, a crystal oscillator or the like.

The direct digital synthesizer 12 receives the information of the modulation start phase from the phase setting unit 11, receives the clock signal from the basic clock generation unit 18, and receives the frequency information of the modulation fundamental wave signal from the LF fundamental wave frequency setting unit 19. The direct digital synthesizer 12 generates a modulation fundamental wave signal whose frequency is equal to the second fundamental frequency F2, by using the modulation start phase, the frequency information, and the amplitude information while using the clock signal. For example, the modulation fundamental wave signal is generated as a sine wave signal that is based on the modulation start phase and that satisfies the frequency information and the amplitude information. The direct digital synthesizer 12 supplies the modulation fundamental wave signal to the multiplier 13. Note that the modulation fundamental wave signal is a signal corresponding to the second traveling wave voltage generated by the LF power supply 20, and the cycle of the modulation fundamental wave signal is equal to the cycle of the second traveling wave voltage.

The frequency shift amount setting unit 131 sets a frequency shift amount ΔF to be applied to each of phases within one cycle in the modulation fundamental wave signal, and supplies information about the frequency shift amount ΔF to the multiplier 13. The frequency shift amount ΔF may vary with, for example, a phase at the time of applying modulation in a range of −ΔFmax to +ΔFmax. For example, ΔFmax=1.2 MHz.

The multiplier 13 receives the modulation fundamental wave signal from the direct digital synthesizer 12, and receives the information of the frequency shift amount ΔF from the frequency shift amount setting unit 131. The multiplier 13 multiplies the modulation fundamental wave signal by the frequency shift amount ΔF and supplies a multiplication result as a modulation signal to the adder 15.

The HF fundamental wave frequency setting unit 14 generates frequency information of the fundamental wave signal whose frequency is equal to the first fundamental frequency F1. The frequency information is information sequentially including the amplitude for each clock timing in accordance with the frequency of the fundamental wave signal (for example, sine wave signal) to be generated. The HF fundamental wave frequency setting unit 14 supplies the frequency information of the fundamental wave signal to the adder 15.

The adder 15 receives the fundamental wave signal with the first fundamental frequency F1 from the HF fundamental wave frequency setting unit 14, and receives the modulation signal from the multiplier 13. The adder 15 adds the modulation signal to the fundamental wave signal and generates the frequency information indicating the first fundamental frequency F1+ΔF. The adder 15 supplies the frequency information to the direct digital synthesizer 16.

The direct digital synthesizer 16 receives frequency information from the adder 15 and the amplitude information from the HF power supply 10. The direct digital synthesizer 16 generates, by using the frequency information and the amplitude information, a modulated wave obtained by frequency-modulating the fundamental wave having the first fundamental frequency F1 by the frequency shift amount ΔF. The direct digital synthesizer 16 supplies the modulated wave to the processing unit 17.

The processing unit 17 performs predetermined processing on the modulated wave output from the direct digital synthesizer 16. The processing unit 17 includes an amplifier, a filter, a synthesizer, and so forth. The predetermined processing includes amplification processing of amplifying a modulated wave, filter processing for detecting a traveling wave and a reflected wave in the modulated wave by the Superheterodyne method or the like, and synthesizing processing of synthesizing a deviation of traveling wave power from target power and feeding back the deviation to the direct digital synthesizer 16. The processing unit 17 outputs the processed modulated wave (first traveling wave voltage) to the superposition matcher 30.

Figure 2:
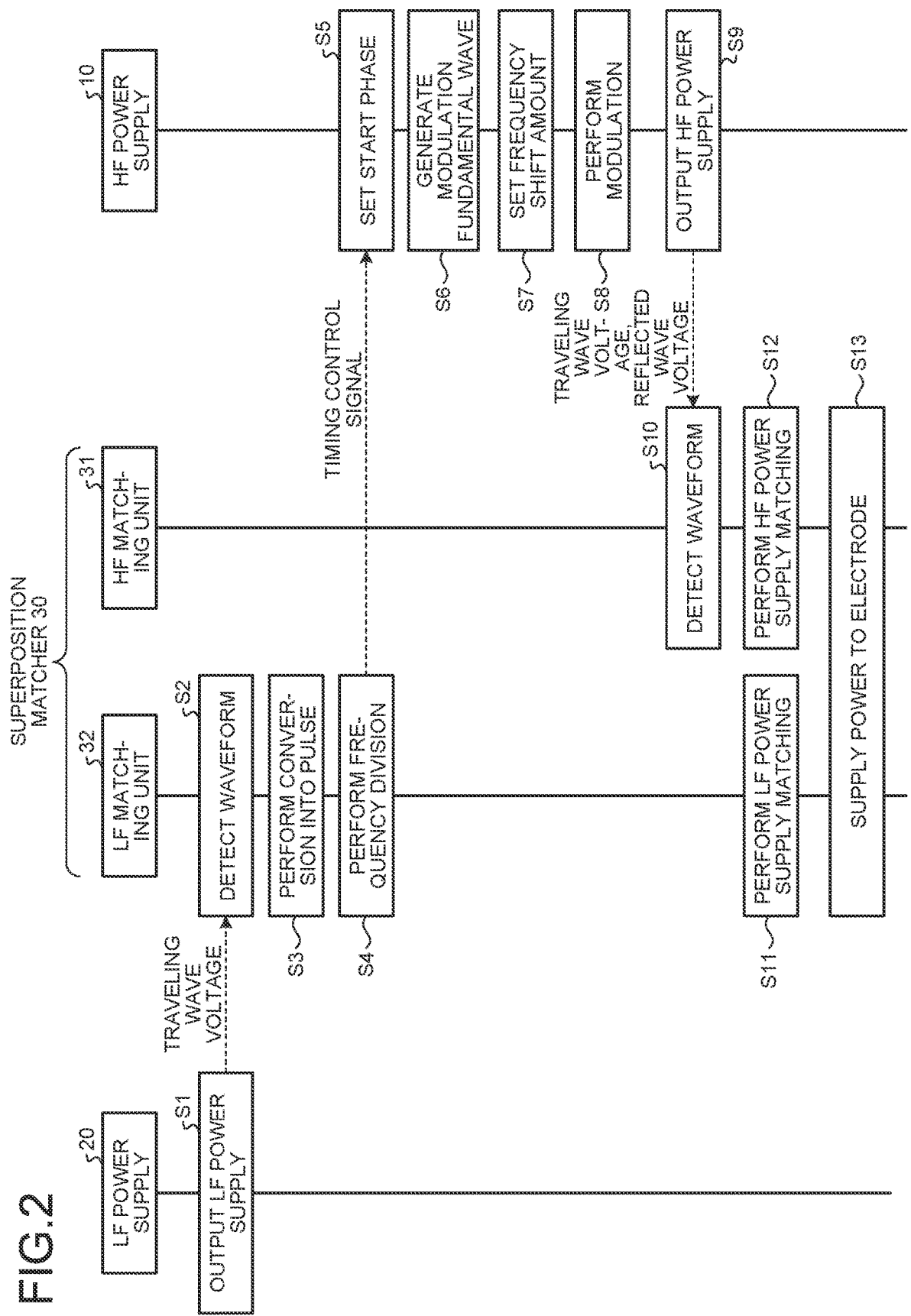
FIG. 2 is a sequence chart illustrating operation of the high-frequency power supply apparatus according to the embodiment.
Figure 3:
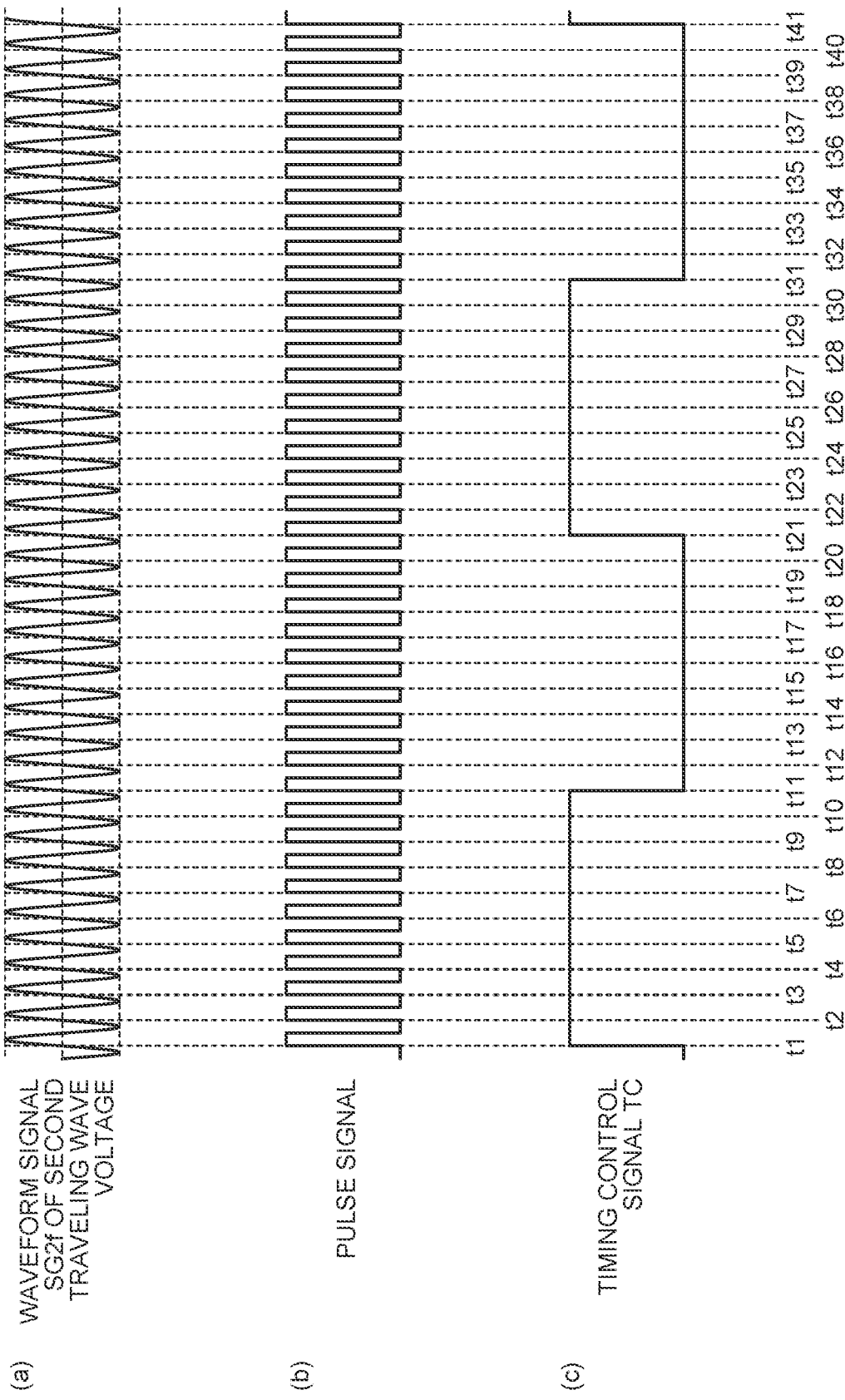
FIG. 3 is a waveform diagram illustrating operation of the high-frequency power supply apparatus according to the embodiment.
Figure 4:
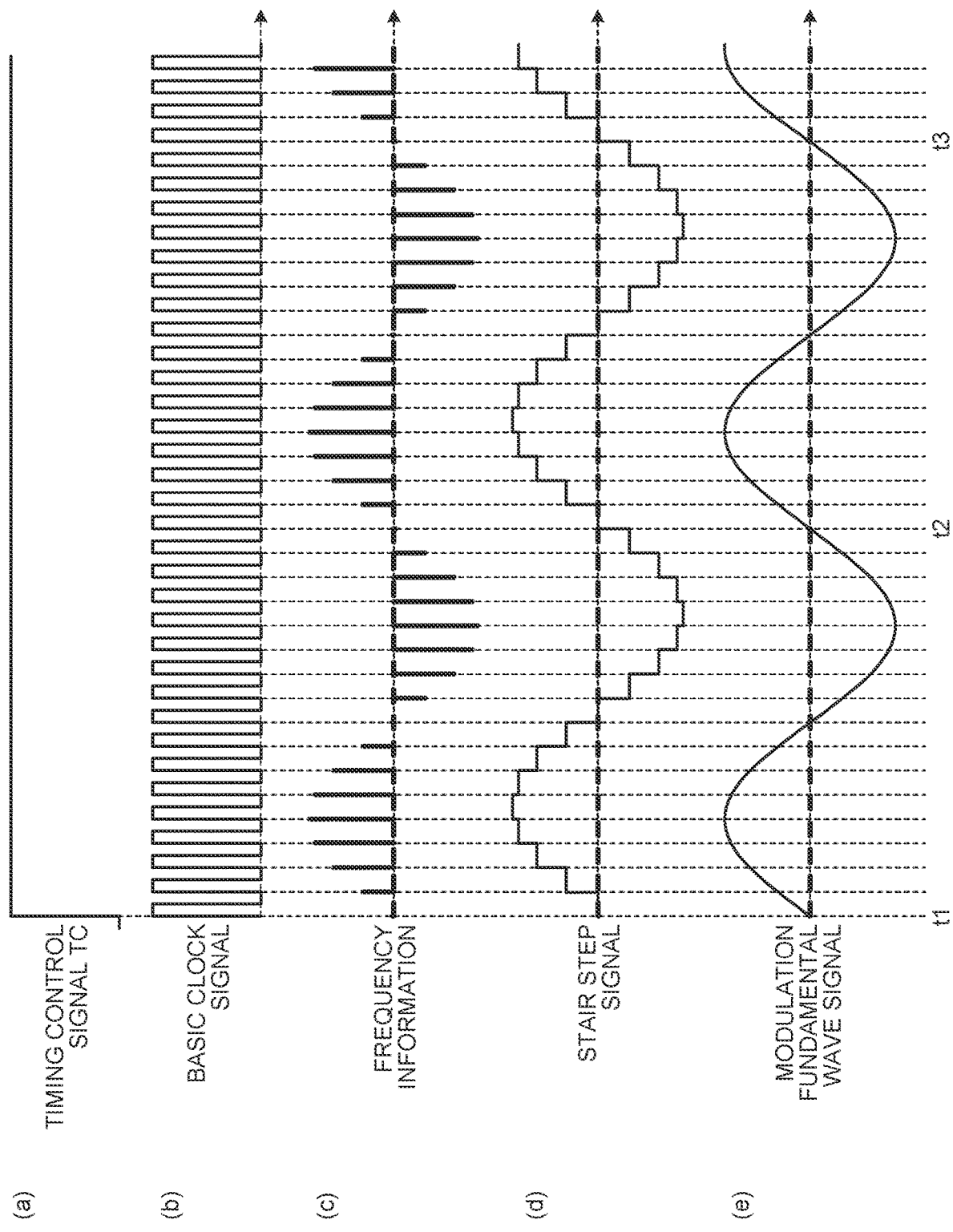
FIG. 4 is a waveform diagram illustrating operation of the high-frequency power supply apparatus according to the embodiment.

Next, operation of the high-frequency power supply apparatus 1 will be described with reference to FIG. 2 to FIG. 5. FIG. 2 is a sequence chart illustrating operation of the high-frequency power supply apparatus 1. FIG. 3 to FIG. 5 are waveform diagrams illustrating operation of the high-frequency power supply apparatus 1.

In response to the activation instruction of the high-frequency power supply apparatus 1, the LF power supply 20 generates the second traveling wave voltage and outputs the second traveling wave voltage to the LF matching unit 32 of the superposition matcher 30 (S1).

The LF matching unit 32 detects the waveform signal SG2f of the second traveling wave voltage output from the LF power supply 20, and detects the waveform signal SG2r of the second reflected wave voltage reflected from the matching circuit 323 side (S2). For example, as illustrated in (a) of FIG. 3, the LF matching unit 32 detects the waveform signal SG2f having a sinusoidal shape with the second fundamental frequency F2. In the waveform signal SG2f, for example, a period between timings t1 and t2, a period between timings t2 and t3, . . . , and a period between timings t40 and t41 are each one cycle corresponding to the basic cycle of the LF power supply 20.

The LF matching unit 32 converts the waveform signal SG2f into a pulse signal (S3). For example, the LF matching unit 32 may generate the pulse signal as illustrated in (b) of FIG. 3 by, for example, setting H level when the amplitude of the sine wave signal exceeds an amplitude center indicated by the one-dot chain line in (a) of FIG. 3 and L level when the amplitude falls below the amplitude center. In the pulse signal, for example, a period between timings t1 and t2, a period between timings t2 and t3, . . . , and a period between timings t40 and t41 are each one cycle corresponding to the basic cycle of the LF power supply 20.

The LF matching unit 32 divides, by N, the pulse signal whose frequency is equal to the second fundamental frequency F2, and generates the timing control signal TC with the frequency F3 (S4). There is a relationship of F3=F2×1/N. The LF matching unit 32 divides, for example, the pulse signal illustrated in (b) of FIG. 3 by 20 to generate the timing control signal TC illustrated in (c) of FIG. 3. The signal (c) of FIG. 3 is obtained in a case where N=20. The LF matching unit 32 outputs the timing control signal TC to the HF power supply 10. In the timing control signal TC, a period from timings t1 to t21 and a period from timings t21 to t41 are each one cycle corresponding to N times (for example, times) the basic cycle of the LF power supply 20.

The HF power supply 10 sets a phase at which modulation is to be started in accordance with the timing control signal TC (S5), and generates a modulation fundamental wave signal (S6). The HF power supply 10 receives the timing control signal TC illustrated in, for example, (a) of FIG. 4. The HF power supply 10 starts generating the modulation fundamental wave signal from timing t1 synchronized with the timing control signal TC illustrated in (a) of FIG. 4. That is, the HF power supply 10 generates a stair step signal as illustrated in (d) of FIG. 4 with reference to the frequency information as illustrated in (c) of FIG. 4 in synchronization with the basic clock signal illustrated in (b) of FIG. 4 from a timing t1. When the HF power supply 10 finishes making reference to the amplitude of one cycle in the frequency information at timings t1 to t2, the HF power supply 10 returns to the head amplitude of one cycle in the frequency information and refers to the head amplitude at a next timing t2. This operation is repeated every cycle of the sine wave. The HF power supply 10 smooths the stair step signal illustrated in (d) of FIG. 4 to generate a modulation fundamental wave signal having a sinusoidal shape as illustrated in (e) of FIG. 4. The HF power supply 10 multiplies the modulation fundamental wave signal by the frequency shift amount ΔF to obtain a modulation signal (S7). The modulation signal includes the frequency shift amount ΔF. The HF power supply 10 adds the modulation signal to the fundamental wave signal and generates the frequency information indicating the frequency F1+ΔF. The HF power supply 10 performs frequency-modulation on the fundamental wave with the first fundamental frequency F1 by a frequency modulation amount ΔF to generate a modulated wave (S8).

Note that, as illustrated in (a) of FIG. 5, the HF power supply 10 may reset the setting of the phase at which modulation is to be started for each of edge timings t1, t21, and t41 of the timing control signal TC, and repeat the processing of S5 to S8. For example, the HF power supply 10 can determine that the frequency modulation control is completed in response to detecting that a reflection coefficient R (or reflected wave power) becomes equal to or less than a threshold value. With this operation, the accuracy of the frequency modulation control can be enhanced.

On completing the frequency modulation control, the HF power supply 10 generates the first high-frequency voltage (first traveling wave voltage) by using the modulated wave and outputs the first high-frequency voltage to the HF matching unit 31 of the superposition matcher 30 (S9).

The HF matching unit 31 detects the waveform signal SG1f of the first traveling wave voltage output from the HF power supply 10, and detects the waveform signal SG1r of the reflected wave voltage reflected from the matching circuit 313 side (S10). The LF matching unit 32 of the superposition matcher 30 performs the second matching operation on the LF power supply 20 side and the lower electrode EL1 side in accordance with the waveform signal SG2f and the waveform signal SG2r detected in S2 (S11). At the same time, the HF matching unit 31 performs the first matching operation on the HF power supply 10 side and the lower electrode EL1 side in accordance with the waveform signal SG1f and the waveform signal SG1r detected in S10

(S12). In the state where the first matching operation and the second matching operation have been performed, the superposition matcher 30 receives the first traveling wave voltage from the HF power supply 10 by the HF matching unit 31, and receives the second traveling wave voltage from the LF power supply 20 by the LF matching unit 32. The superposition matcher 30 superposes the first traveling wave voltage (first high-frequency power) of the HF matching unit 31 and the second traveling wave voltage (second high-frequency power) of the LF matching unit 32, and then supplies the traveling wave voltage after the superposition (high-frequency power after the superposition) to the lower electrode EL1 (S13).

As described above, in the high-frequency power supply apparatus 1 according to the present embodiment, the LF matching unit 32 generates the timing control signal TC in accordance with the second traveling wave voltage and supplies the timing control signal TC to the HF power supply 10. The HF power supply 10 sets the start phase of the modulation signal in accordance with the timing control signal TC and generates the modulation signal on the basis of the start phase of the modulation signal. The HF power supply 10 performs the frequency modulation control on the first traveling wave voltage (first high-frequency voltage) by using the modulation signal. Therefore, the influence of intermodulation distortion can be suppressed with high accuracy.

Note that the timing control signal TC supplied from the frequency dividing processing unit 3222 illustrated in FIG. 1 to the phase setting unit 11 has a relatively low frequency as illustrated in (c) of FIG. 3. In a case where the frequency of the timing control signal TC is 100 kHz or less, a cable cheaper than a coaxial cable can be used as a communication line connecting the frequency dividing processing unit 3222 of the LF matching unit 32 and the phase setting unit 11 of the HF power supply 10. Such an inexpensive cable is, for example, a cable having no outer conductor outside the inner conductor in cross-sectional view, namely, having no shield line outside the signal line. With this configuration, the cost of the high-frequency power supply apparatus 1 can be reduced.

While certain embodiments have been described, these embodiments have been presented by way of example only, and are not intended to limit the scope of the inventions. Indeed, the novel methods and systems described herein may be embodied in a variety of other forms, furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

With the high-frequency power supply apparatus according to the present disclosure, the first power supply can generate the modulation signal whose cycle is equal to the cycle of the high-frequency voltage output from the second power supply.

What is claimed is:

1. A high-frequency power supply apparatus comprising:
   a first power supply configured to supply first high-frequency power to a load by outputting a first high-frequency voltage with a first fundamental frequency;
   a second power supply configured to supply second high-frequency power to the load by outputting a second high-frequency voltage with a second fundamental frequency being lower than the first fundamental frequency;
   a first matching device connected between the first power supply and the load; and
   a second matching device connected between the second power supply and the load, wherein
   the second matching device is configured to
      generate a timing control signal with a frequency being lower than the second fundamental frequency on the basis of detection information of the second high-frequency voltage, and
      supply the timing control signal to the first power supply, and the first power supply is further configured to
      generate a modulation signal by applying a start phase and a frequency shift amount to a modulation fundamental wave signal whose frequency is equal to the second fundamental frequency, the start phase being applied to the modulation fundamental wave signal in accordance with an input timing of the timing control signal, and
      perform frequency modulation on the first high-frequency voltage by using the modulation signal.

2. The high-frequency power supply apparatus according to claim 1, wherein the second matching device is configured to
   extract a pulse signal whose frequency is equal to the second fundamental frequency, from detection information of the second high-frequency voltage, and
   generate the timing control signal by frequency-dividing the pulse signal.

3. The high-frequency power supply apparatus according to claim 2, wherein the second matching device includes:
   a sensor configured to detect the second high-frequency voltage and output a detected waveform signal;
   a conversion circuit configured to convert the detected waveform signal into the pulse signal; and
   a frequency dividing circuit configured to generate the timing control signal by frequency-dividing the pulse signal.

4. The high-frequency power supply apparatus according to claim 3, wherein, when N is an integer of two or more, a frequency of the timing control signal is a frequency of at least 1/N times or less the second fundamental frequency.

5. The high-frequency power supply apparatus according to claim 2, wherein, when N is an integer of two or more, a frequency of the timing control signal is a frequency of at least 1/N times or less the second fundamental frequency.

6. The high-frequency power supply apparatus according to claim 1, wherein, when N is an integer of two or more, a frequency of the timing control signal is a frequency of at least 1/N times or less the second fundamental frequency.

7. The high-frequency power supply apparatus according to claim 1, wherein the first power supply includes:
   a phase setting circuit configured to set a modulation start phase at which modulation is to be started at the same timing as the second high-frequency voltage, the modulation start phase being set by using the timing control signal;
   a basic clock generation circuit configured to generate a basic clock signal;
   a low frequency (LF) fundamental wave frequency setting circuit configured to output frequency information of a modulation fundamental wave whose frequency is equal to the second fundamental frequency;
   a direct digital synthesizer circuit configured to output a modulation fundamental wave signal whose frequency is equal to the second fundamental frequency, the modulation fundamental wave signal being output by using the modulation start phase and the frequency information of the modulation fundamental wave;

a frequency shift amount setting circuit configured to set a frequency shift amount for the modulation fundamental wave signal;

a multiplier circuit configured to output the modulation signal by multiplying the modulation fundamental wave signal and the frequency shift amount, the modulation signal to be output being a signal obtained by shifting amplitude of the modulation fundamental wave signal on the basis of the frequency shift amount;

a high frequency (HF) fundamental wave frequency setting circuit configured to output frequency information of a fundamental wave signal whose frequency is equal to the first fundamental frequency;

an adder circuit configured to output frequency information obtained by adding the frequency information of the fundamental wave signal and the modulation signal;

a direct digital synthesizer circuit configured to output a modulated wave obtained by performing frequency-modulation on the fundamental wave signal by using the modulation signal on the basis of the basic clock signal and the frequency information output by the adder circuit; and an amplifier configured to amplify and output the modulated wave.

* * * * *